(12) United States Patent
Kim et al.

(10) Patent No.: US 10,847,946 B2
(45) Date of Patent: Nov. 24, 2020

(54) LIGHT SOURCE PACKAGE

(71) Applicant: SAMSUNG ELECTRONICS CO., LTD., Suwon-si (KR)

(72) Inventors: Kyoungjun Kim, Yongin-si (KR); Jongsup Song, Hwaseong-si (KR); Seol-Young Choi, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/504,000

(22) Filed: Jul. 5, 2019

(65) Prior Publication Data

US 2020/0194966 A1    Jun. 18, 2020

(30) Foreign Application Priority Data

Dec. 17, 2018    (KR) .................. 10-2018-0163462

(51) Int. Cl.
| | |
|---|---|
| *H01S 5/00* | (2006.01) |
| *H01S 5/022* | (2006.01) |
| *H01S 5/026* | (2006.01) |
| *H01S 5/024* | (2006.01) |
| *H01S 5/068* | (2006.01) |

(52) U.S. Cl.
CPC ........ *H01S 5/02252* (2013.01); *H01S 5/0267* (2013.01); *H01S 5/02288* (2013.01); *H01S 5/02469* (2013.01); *H01S 5/02476* (2013.01); *H01S 5/06825* (2013.01)

(58) Field of Classification Search
CPC ............... H01S 5/02288; H01S 5/0267; H01S 5/02469; H01S 5/02476; H01S 5/06825; H01S 5/02252
See application file for complete search history.

(56) References Cited

U.S. PATENT DOCUMENTS

| | | | |
|---|---|---|---|
| 5,615,052 A * | 3/1997 | Doggett | G01N 21/274 359/642 |
| 8,115,217 B2 | 2/2012 | Duong et al. | |
| 8,492,696 B2 | 7/2013 | Akerman et al. | |
| 8,586,128 B2 | 11/2013 | Shin et al. | |
| 8,684,572 B2 * | 4/2014 | Weber | F21V 15/01 362/507 |
| 8,913,641 B2 * | 12/2014 | Seibert | G02B 7/021 372/50.23 |
| 9,726,435 B2 | 8/2017 | Dahm | |
| 2007/0237196 A1 * | 10/2007 | Oomori | H01S 5/02236 372/36 |

(Continued)

FOREIGN PATENT DOCUMENTS

| | | |
|---|---|---|
| JP | 2010-171217 | 8/2010 |
| KR | 20-2008-0000241 | 2/2008 |

(Continued)

*Primary Examiner* — Kinam Park
(74) *Attorney, Agent, or Firm* — F. Chau & Associates, LLC

(57) ABSTRACT

A light source package includes a substrate, a light emitting device disposed on the substrate, a lens disposed on the light emitting device, a housing disposed on the substrate, and a conductive member disposed in the housing. The lens is spaced apart from the light emitting device, the housing is disposed on a side surface and a portion of a top surface of the lens, and the conductive member is electrically connected to the light emitting device.

20 Claims, 21 Drawing Sheets

(56) References Cited

U.S. PATENT DOCUMENTS

2016/0124240 A1* 5/2016 Chern .................... H01S 5/183
                                                          359/558

FOREIGN PATENT DOCUMENTS

| KR | 10-2013-0117107 | 10/2013 |
| KR | 10-1346590 | 12/2013 |
| WO | 2004102685 | 11/2004 |

* cited by examiner

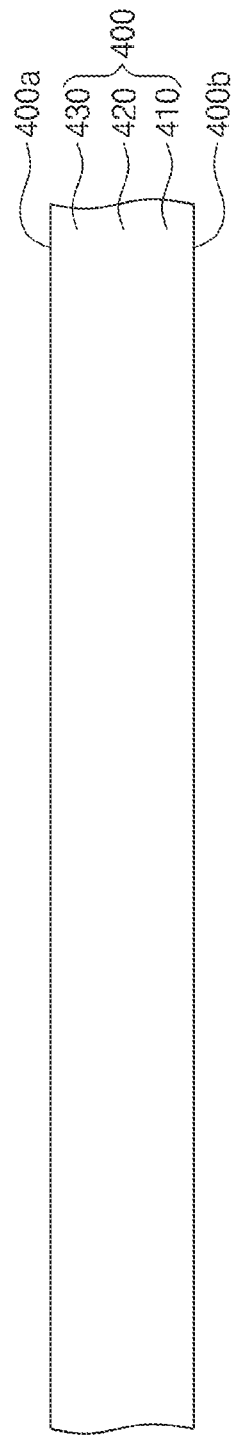

LIGHT SOURCE PACKAGE

CROSS-REFERENCE TO RELATED APPLICATIONS

This application claims priority under 35 U.S.C § 119 to Korean Patent Application No. 10-2018-0163462 filed on Dec. 17, 2018 in the Korean Intellectual Property Office, the disclosure of which is incorporated by reference herein in its entirety.

TECHNICAL FIELD

Exemplary embodiments of the present inventive concept relate to a light source package, and more particularly, to a light source package including a housing.

DISCUSSION OF THE RELATED ART

A light source package may emit an infrared ray resulting from a reflection layer and a material included in a device of the light source package. The infrared ray may be generated by recombination of electrons and holes of combined semiconductors and amplified between upper and lower reflections layers.

Such a light source package has recently been used for three-dimensional (3D) sensing in communication devices (e.g., smartphones and tablet computers). With the proliferation of these devices, the development of such a light source package is being accelerated. In a case in which such a light source package is used in portable products (e.g., smartphones or tablet computers) for 3D sensing (e.g., facial recognition), safety precautions should be taken when designing and manufacturing the light source package, since the light emitted by the light source package will be irradiated onto a human face.

SUMMARY

Exemplary embodiments of the present inventive concept provide a light source package with improved safety and reliability.

According to exemplary embodiments of the present inventive concept, a light source package includes a substrate, a light emitting device disposed on the substrate, a lens disposed on the light emitting device, a housing disposed on the substrate, and a conductive member disposed in the housing. The lens is spaced apart from the light emitting device, the housing is disposed on a side surface and a portion of a top surface of the lens, and the conductive member is electrically connected to the light emitting device.

According to exemplary embodiments of the present inventive concept, a light source package includes a substrate, a laser device mounted on the substrate, a housing disposed on a top surface of the substrate and spaced apart from the laser device, a conductive member disposed in the housing and electrically connected to the laser device, and a lens disposed between the laser device and the housing. An uppermost top surface of the housing is disposed at a higher level than a level of a top surface of the lens.

According to exemplary embodiments of the present inventive concept, a light source package includes a substrate, a light emitting device disposed on the substrate, a housing disposed on the substrate and including an inner surface that faces the light emitting device, a lens disposed between a top surface of the light emitting device and the inner surface of the housing, and a conductive member disposed in the housing and electrically connected to the light emitting device.

BRIEF DESCRIPTION OF THE DRAWINGS

The above and other features of the present inventive concept will become more apparent by describing in detail exemplary embodiments thereof with reference to the accompanying drawings, in which:

FIGS. 10A to 10C illustrate cross-sectional views showing a lens according to exemplary embodiments.

DETAILED DESCRIPTION OF THE EXEMPLARY EMBODIMENTS

Figure 1A:
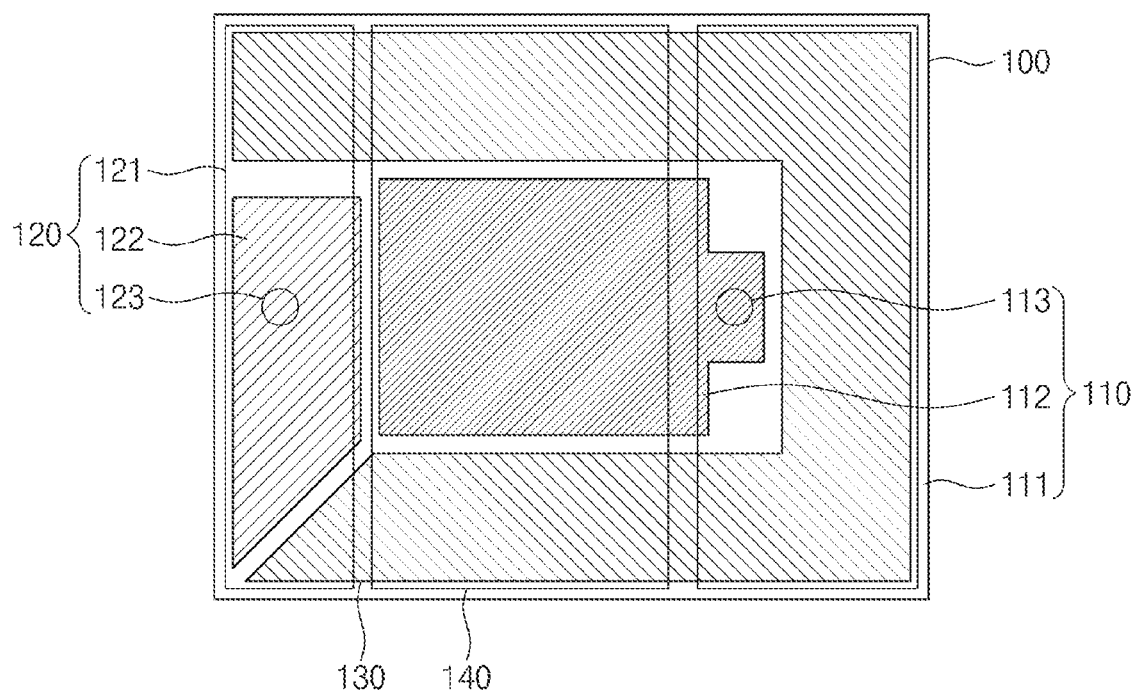
FIG. 1A illustrates a plan view showing a substrate according to exemplary embodiments.

Exemplary embodiments of the present inventive concept will be described more fully hereinafter with reference to the accompanying drawings. Like reference numerals may refer to like elements throughout the accompanying drawings.

A light source package according to exemplary embodiments of the present inventive concept will be described below.

Figure 1B:
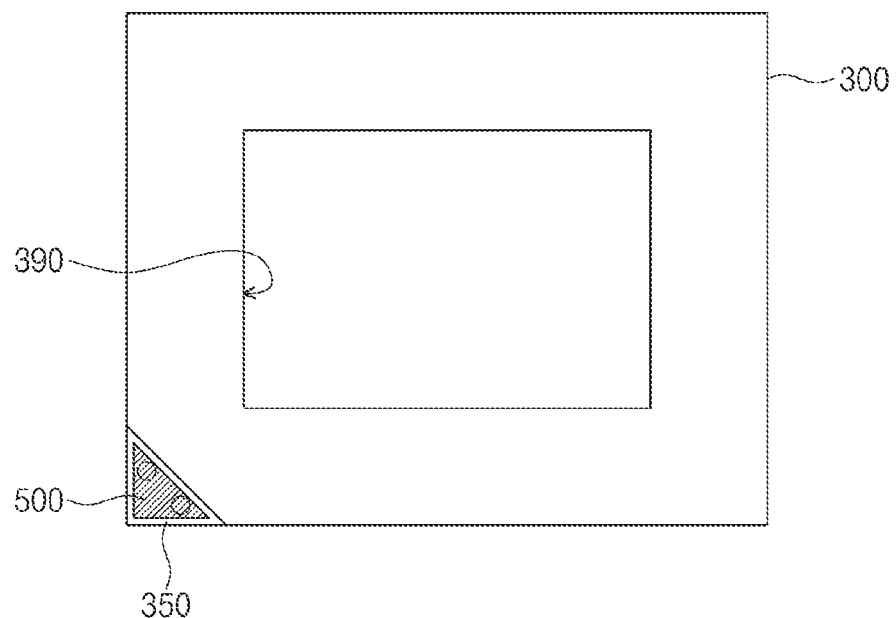
FIG. 1B illustrates a plan view showing a housing according to exemplary embodiments.
Figure 2:
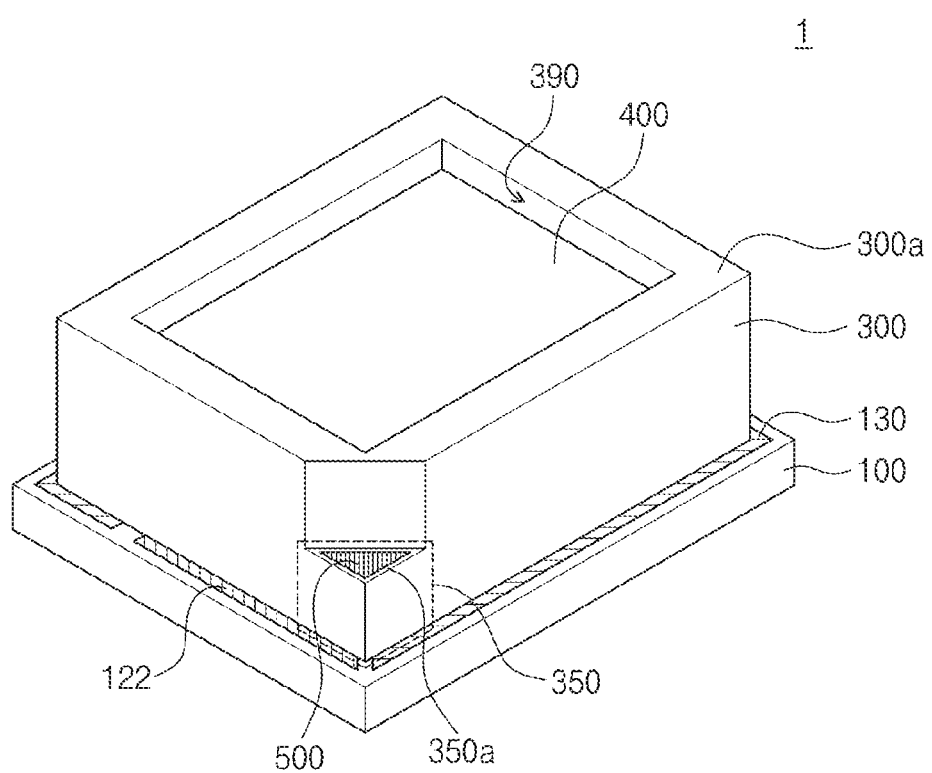
FIG. 2 illustrates a perspective view showing a light source package according to exemplary embodiments.
Figure 3A:
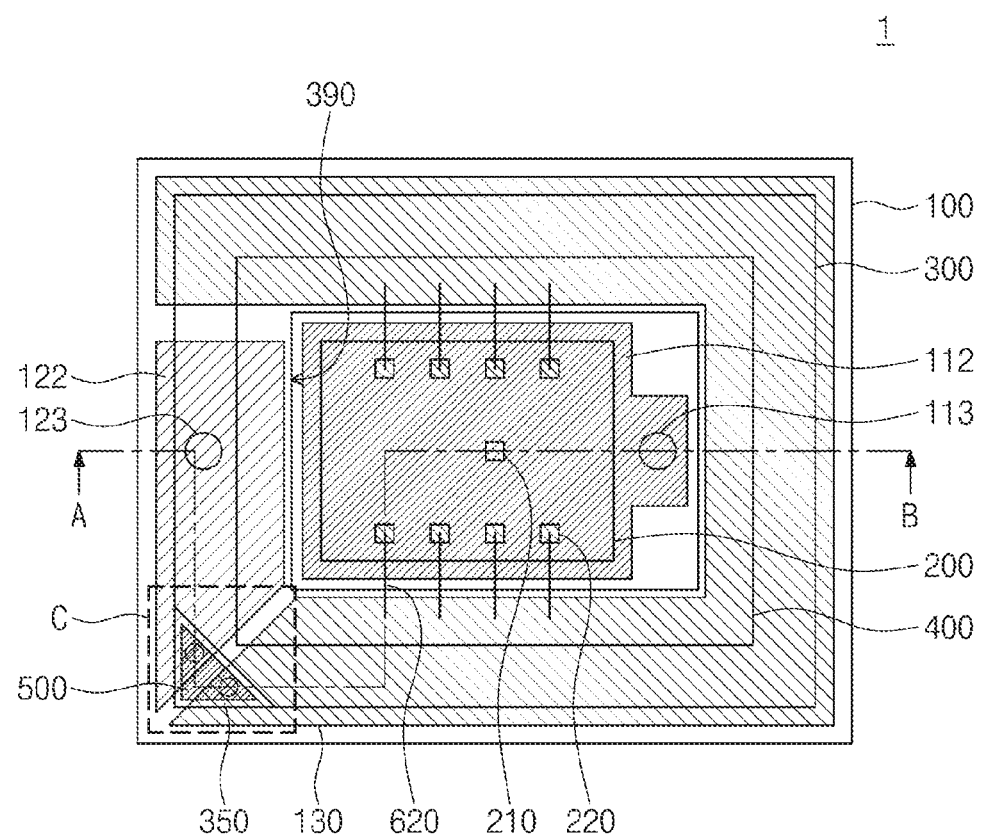
FIG. 3A illustrates a plan view showing the light source package of FIG. 2.
Figure 3B:
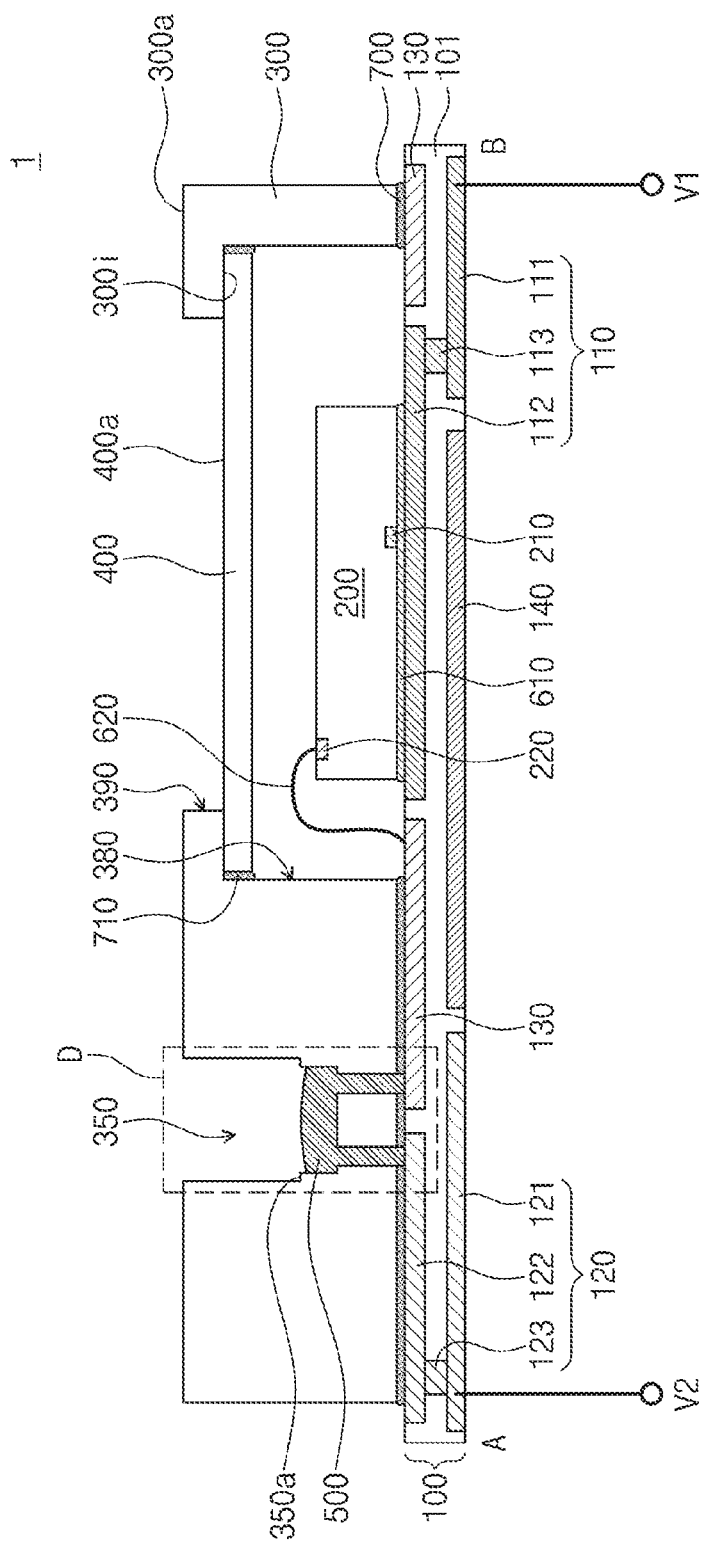
FIG. 3B illustrates a cross-sectional view taken along line A-B of FIG. 3A.
Figure 3C:
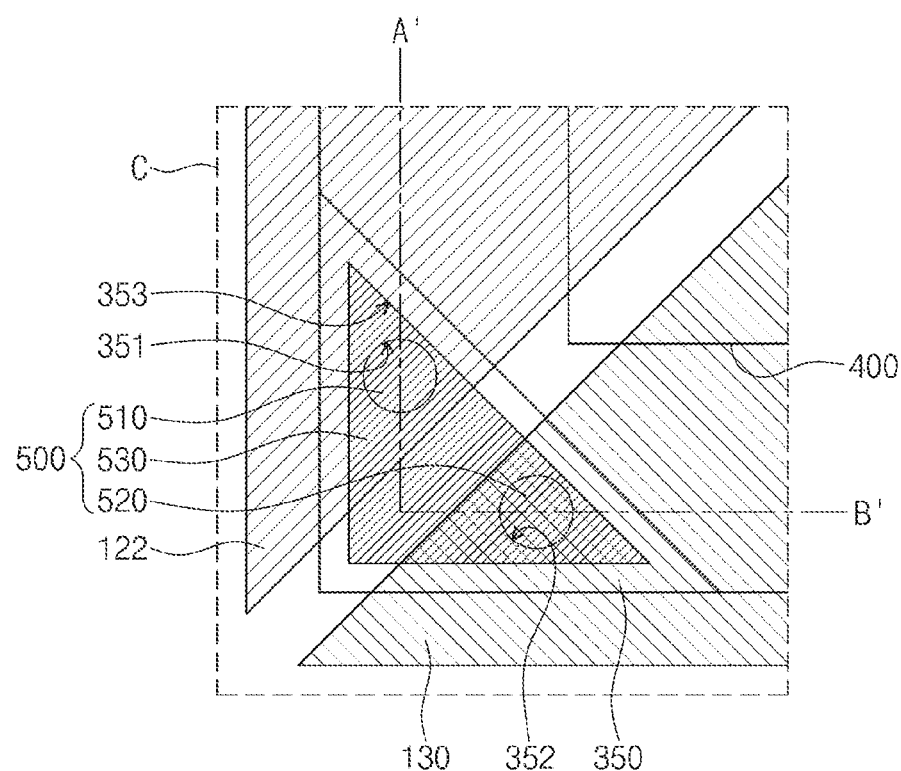
FIG. 3C illustrates an enlarged view of section C shown in FIG. 3A.
Figure 3D:
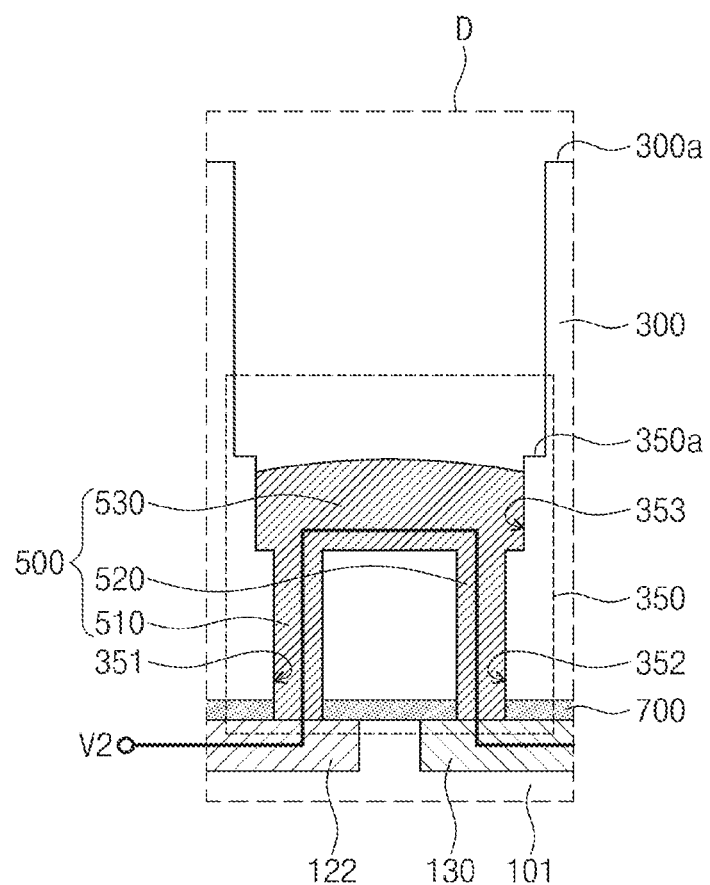
FIG. 3D illustrates an enlarged view of section D shown in FIG. 3B.
Figure 3E:
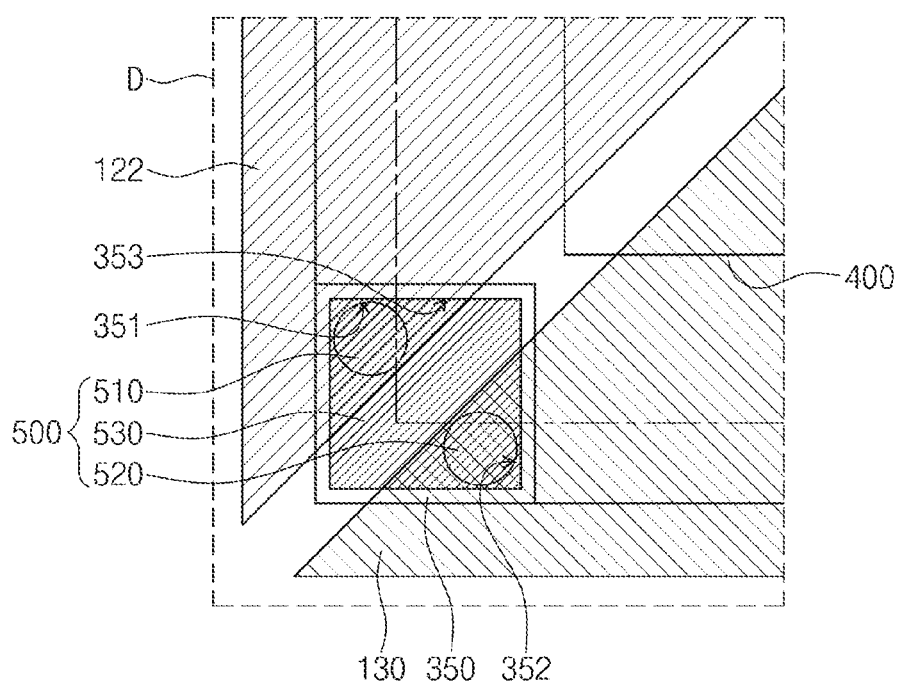
FIG. 3E illustrates a plan view showing a conductive member according to exemplary embodiments.

FIG. 1A illustrates a plan view showing a substrate according to exemplary embodiments. FIG. 1B illustrates a plan view showing a housing according to exemplary embodiments. FIG. 2 illustrates a perspective view showing a light source package according to exemplary embodiments. FIG. 3A illustrates a plan view showing the light source package of FIG. 2. FIG. 3B illustrates a cross-sectional view taken along line A-B of FIG. 3A. FIG. 3C illustrates an enlarged view of section C shown in FIG. 3A. FIG. 3D illustrates an enlarged cross-sectional view showing section D of FIG. 3B taken along line A'-B' of FIG. 3C. FIG. 3E illustrates an enlarged cross-sectional view of section C depicted in FIG. 3A, showing a conductive member according to exemplary embodiments.

Referring to FIGS. 1A, 1B, 2, and 3A to 3E, a light source package 1 may include a substrate 100, a light emitting device 200, a housing 300, a lens 400, and a conductive member 500. The substrate 100 may include, for example, a printed circuit board (PCB). The light source package 1 may be an infrared ray source package, which emits an infrared ray. The substrate 100 shown in FIG. 1A may be used to fabricate the light source package 1. As shown in FIGS. 1A and 3B, the substrate 100 may include a dielectric layer 101, a first conductive structure 110, a second conductive structure 120, and a third upper conductive pattern 130. The dielectric layer 101 may have a top surface and a bottom surface that face each other. The dielectric layer 101 may include, for example, a silicon-based dielectric material, an organic dielectric material, or a carbon-containing dielectric material. The dielectric layer 101 may be a single layer or may include multiple layers.

The first conductive structure 110 may include a first lower conductive pattern 111, a first conductive via 113, and a first upper conductive pattern 112. The first lower conductive pattern 111 may be disposed on the bottom surface of the dielectric layer 101. The first upper conductive pattern 112 may be disposed on the top surface of the dielectric layer 101. The top surface of the dielectric layer 101 may face the bottom surface of the dielectric layer 101. The top surface of the dielectric layer 101 may correspond to a top surface of the substrate 100. The first conductive via 113 may be disposed in the dielectric layer 101 and may be coupled to the first lower conductive pattern 111 and the first upper conductive pattern 112. The first conductive via 113 may penetrate at least a portion of the dielectric layer 101. The first conductive structure 110 may be configured to receive a first voltage V1. For example, the first voltage V1 may be applied to the first lower conductive pattern 111, and then transferred to the first conductive via 113 and the first upper conductive pattern 112. The first conductive structure 110 may include a metal such as, for example, copper or aluminum.

The second upper conductive pattern 122 may be insulated from the first upper conductive pattern 112. The third upper conductive pattern 130 may be spaced apart from the first upper conductive pattern 112 and the second upper conductive pattern 122. The third upper conductive pattern 130 may be electrically connected to the second upper conductive pattern 122 through the conductive member 500.

The second conductive structure 120 may include a second lower conductive pattern 121, a second conductive via 123, and a second upper conductive pattern 122. The second lower conductive pattern 121 may be disposed on the bottom surface of the dielectric layer 101. The second upper conductive pattern 122 may be disposed on the top surface of the dielectric layer 101. The second conductive via 123 may be disposed in the dielectric layer 101 and may be coupled to the second lower conductive pattern 121 and the second upper conductive pattern 122. The second conductive structure 120 may be configured to receive a second voltage V2. For example, the second voltage V2 may be applied to the second lower conductive pattern 121, and then transferred to the second conductive via 123 and the second upper conductive pattern 122. The second voltage V2 may be different from the first voltage V1. For example, one of the first and second voltages V1 and V2 may be a positive voltage, and the other one of the first and second voltages V1 and V2 may be a negative voltage. For example, one of the first and second voltages V1 and V2 may be a ground voltage, and the other one of the first and second voltages V1 and V2 may be a power voltage. The second conductive structure 120 may be insulated from the first conductive structure 110. For example, the dielectric layer 101 may be disposed between the first conductive structure 110 and the second conductive structure 120. The second conductive structure 120 may include a metal such as, for example, copper or aluminum.

The third upper conductive pattern 130 may be disposed on the top surface of the dielectric layer 101. The dielectric layer 101 may be disposed between the third upper conductive pattern 130 and the first conductive structure 110. The third upper conductive pattern 130 may be insulated from the first conductive structure 110. The dielectric layer 101 may be interposed between the third upper conductive pattern 130 and the second conductive structure 120. In exemplary embodiments, the third upper conductive pattern 130 does not have a direct electrical connection with the first conductive structure 110. For example, in exemplary embodiments, when viewed in a plan view, the third upper conductive pattern 130 may be spaced apart from the second conductive via 123 and the second upper conductive pattern 122, and has no direct electrical connection with the second conductive via 123 and the second upper conductive pattern 122.

The substrate 100 may further include a heat radiation plate 140. The heat radiation plate 140 may be disposed on the bottom surface of the dielectric layer 101. As shown in FIG. 1A, when viewed in a plan view, the heat radiation plate 140 may be spaced apart from the first and second lower conductive patterns 111 and 121. The heat radiation plate 140 may be insulated from the first and second lower conductive patterns 111 and 121. The heat radiation plate 140 may include the same material as that of the first and second lower conductive patterns 111 and 121, and may have substantially the same thickness as that of the first and second lower conductive patterns 111 and 121. For example, these thicknesses may be equal to each other within a measurement error, or if measurably unequal, are close enough in value to be functionally equal to each other as would be understood by a person having ordinary skill in the art. When viewed in a plan view, the heat radiation plate 140 may overlap the light emitting device 200. The heat radiation plate 140 may have a high thermal conductivity. The heat radiation plate 140 may include a metal such as, for example, copper or aluminum. When the light source package 1 operates, the heat radiation plate 140 may promptly discharge heat produced from the light emitting device 200. Therefore, the thermal characteristics of the light source package 1 may be improved. As a result, damage may be prevented and performance may be improved.

As shown in FIGS. 3A and 3B, the light emitting device 200 may be disposed on the top surface of the substrate 100. For example, the light emitting device 200 may be disposed on a top surface of the first upper conductive pattern 112. The light emitting device 200 may have a top surface and a bottom surface that face each other. The top surface of the light emitting device 200 may serve as a light emitting surface. For example, pixel arrays may be disposed in a central region of the top surface of the light emitting device 200. When the light emitting device 200 operates, light may be emitted from the central region of the top surface of the light emitting device 200. The light emitting device 200 may be, for example, an infrared ray emitting device that emits light of an infrared ray band.

The light emitting device 200 may include a first terminal 210 and a second terminal 220. The first terminal 210 may be disposed on the bottom surface of the light emitting device 200. The first terminal 210 may be a pad or a conductive pattern. A conductive adhesive layer 610 may be disposed between the substrate 100 and the light emitting device 200, and may be coupled to the first upper conductive pattern 112 and the first terminal 210. The conductive adhesive layer 610 may include, for example, metal particles distributed in resin. However, the conductive adhesive layer 610 is not limited thereto. The first voltage V1 may be transferred to the first terminal 210 through the first conductive structure 110 and the conductive adhesive layer 610. In this description, the phrase "voltage is applied to the light emitting device 200" may mean that "voltage is applied to the first terminal 210 and/or the second terminal 220." Further, the phrase "electrically connected/coupled to the light emitting device 200" may mean "electrically connected/coupled to the first terminal 210 and/or the second terminal 220." The first terminal 210 may include a conductive material such as, for example, a metal. Although FIG. 3B illustrates that the light emitting device 200 includes one first terminal 210, exemplary embodiments are not limited thereto. For example, in exemplary embodiments, the light emitting device 200 may include a plurality of first terminals 210.

The second terminal 220 may be disposed on the top surface of the light emitting device 200. For example, the second terminal 220 may be disposed in an edge region of the top surface of the light emitting device 200. The second terminal 220 may be spaced apart from the pixel arrays in the central region. The second terminal 220 may be a pad. The second terminal 220 may include a conductive material such as, for example, a metal. The second terminal 220 may be insulated from the first terminal 210. A bonding wire 620 may be disposed on the top surface of light emitting device 200 and may be coupled to the second terminal 220 and the third upper conductive pattern 130. In exemplary embodiments, the second terminal 220 may be provided in plural, and the bonding wire 620 may also be provided in plural. In this case, the bonding wires 620 may be coupled to corresponding second terminals 220. Each of the bonding wires 620 may include a metal such as, for example, gold (Au).

The light emitting device 200 may include a laser diode or a light emitting diode. For example, the light emitting device 200 may be a laser device. Herein, the terms light emitting device and laser device are understood to refer to a device that emits light. The light emitting device 200 may include a first semiconductor layer, an active layer, and a second semiconductor layer that are stacked. The first semiconductor layer may have a first conductive type, and the second semiconductor layer may have a second conductive type. The first conductive type may be one of n and p types, and the second conductive type may be the other one of n and p types. The light emitting device 200 may include a laser device which has a resonance structure. In exemplary embodiments, the light emitting device 200 may include a vertical cavity surface emitting laser (VCSEL). In this case, the first semiconductor layer may include a first reflection layer, and the second semiconductor layer may include a second reflection layer. In an exemplary embodiment, the first reflection layer may be a Bragg reflection layer, and the second reflection layer may be a Bragg reflection layer. In an exemplary embodiment, the first reflection layer may be a Bragg reflection layer, and the second reflection layer may have a metasurface. In this case, the second reflection layer may be closer than the first reflection layer to the light emitting surface. In an exemplary embodiment, the first reflection layer may have a metasurface, and the second reflection layer may have a metasurface. The first terminal 210 may be electrically connected to the first semiconductor layer. The first voltage V1 may be applied through the first terminal 210 to the first semiconductor layer. The second terminals 220 may be electrically connected to the second semiconductor layer. When the first voltage V1 is applied to the first terminal 210 and the second voltage V2 is applied to the second terminals 220, the light emitting device 200 may operate. For example, when the first and second voltages V1 and V2 are applied, the light emitting device 200 may generate light caused by electron-hole recombination occurring at the active layer of the light emitting device 200.

The housing 300 may be disposed on the substrate 100. The housing 300 may be spaced apart from the light emitting device 200. The housing 300 may have an inner surface 300i and an outer surface that face each other. The inner surface 300i of the housing 300 may include an inner bottom surface and an inner side surface connected to the inner bottom surface. The inner bottom surface of the housing 300 may face the top surface of the light emitting device 200. The housing 300 may have an opening 390, which penetrates the inner surface 300i and the outer surface of the housing 300. The housing 300 may include a dielectric material. For example, the housing 300 may include a dielectric polymer, a plastic, an anodizing metal, or a dielectric carbon-containing material. An adhesive layer 700 may be disposed between the housing 300 and the substrate 100. For example, the adhesive layer 700 may be interposed between a lowermost bottom surface of the housing 300 and the top surface of the substrate 100. The adhesive layer 700 may fix the housing 300 on the substrate 100. The housing 300 may have a recess 350. As shown in FIGS. 1B, 2, and 3A, the recess 350 may be disposed in an edge region of the housing 300. The recess 350 may have a top surface 350a disposed at a lower level than that of an uppermost top surface 300a of the housing 300. The uppermost top surface 300a of the housing 300 may correspond to a portion of the outer surface of the housing 300.

The housing 300 may have a cavity 380. The cavity 380 may be surrounded by the inner surface 300i of the housing 300. The cavity 380 may be a space in which the light emitting device 200 and the lens 400 are disposed. The lens 400 may be spaced apart from the light emitting device 200. Air may be disposed between the light emitting device 200 and the lens 400.

The lens 400 may be disposed on the light emitting device 200 and may be spaced apart from the top surface of the light emitting device 200. The lens 400 may be disposed between the light emitting device 200 and the housing 300. For example, the lens 400 may be disposed between the top surface of the light emitting device 200 and the inner surface 300i of the housing 300. The housing 300 may be disposed on a side surface and a portion of a top surface 400a of the lens 400, as shown in FIG. 3B. For example, the housing 300 may be disposed on opposite side surfaces of the lens 400, and may be disposed on and contact opposite portions of the top surface 400a of the lens 400. For example, the housing 300 may be disposed on less than an entirety of the top surface 400a of the lens 400. The lens 400 may have a top surface 400a disposed at a lower level than that of the uppermost top surface 300a of the housing 300. For example, a distance between the substrate 100 and the top surface 400a of the lens 400 may be smaller than a distance between the substrate 100 and the uppermost top surface 300a of the housing 300.

The top surface 400a of the lens 400 may be disposed at the same level as or at a lower level than that of the inner bottom surface of the housing 300. The housing 300 may be disposed on a portion of the top surface 400a and a side surface of the lens 400. Therefore, the housing 300 may prevent the lens 400 from being outwardly detached. When viewed in a plan view, the lens 400 may be disposed to overlap the opening 390 of the housing 300. The light generated from the light emitting device 200 may be outwardly emitted through the lens 400 and the opening 390. The opening 390 may have a width less than that of the lens 400. The lens 400 may be a diffusing lens, which has a metasurface.

An adhesive pattern 710 may be disposed between the housing 300 and the lens 400. For example, the adhesive pattern 710 may be disposed between the housing 300 and the side surface of the lens 400. The side surface of the lens 400 may neighbor the top surface 400a. For example, the side surface of the lens 400 may be connected to and adjacent to the top surface 400a of the lens 400. For another example, the adhesive pattern 710 may further extend between the housing 300 and the top surface 400a of the lens 400. The adhesive pattern 710 may fix the lens 400 on the housing 300. The adhesive pattern 710 may include a dielectric material. The adhesive pattern 710 may include a silicon-based material, a polymer, or a resin.

The conductive member 500 may be disposed in the housing 300. For example, at least a portion of the conductive member 500 may be disposed in the recess 350 of the housing 300. As shown in FIGS. 1B, 2, and 3A, when viewed in a plan view, the conductive member 500 may overlap the recess 350 of the housing 300. The conductive member 500 may be electrically connected to the light emitting device 200. As shown in FIG. 3B, the conductive member 500 may have one end (e.g., a first end) coupled to the second upper conductive pattern 122 and the other (e.g., a second end) end coupled to the third upper conductive pattern 130. In this configuration, the second voltage V2 applied to the second conductive structure 120 may be transferred through the conductive member 500 to the third upper conductive pattern 130. The conductive member 500 may include, for example, a solder material, a solder paste, a conductive ink, or a conductive paste. The solder material and the solder paste may include, for example, tin, bismuth, lead, silver, or an alloy thereof. The conductive member 500 in the housing 300 will be discussed below in further detail with reference to FIGS. 3C, 3D, and 3E.

The housing 300 may have a first hole 351, a second hole 352, and a third hole 353. The first and second holes 351 and 352 may be disposed in a lower portion of the recess 350 of the housing 300. Each of the first and second holes 351 and 352 may penetrate the lowermost bottom surface of the housing 300. The first hole 351 may expose the second upper conductive pattern 122. When viewed in a plan view, the second hole 352 may be spaced apart from the first hole 351, as shown in FIGS. 3C and 3E. The second hole 352 may expose the third upper conductive pattern 130. In an exemplary embodiment, the adhesive layer 700 does not extend into the first and second holes 351 and 352. The third hole 353 may be disposed in an upper portion of the recess 350. For example, the third hole 353 may penetrate the top surface 350a of the recess 350. The third hole 353 may be spatially connected to the first and second holes 351 and 352. When viewed in a plan view, the third hole 353 may overlap the first and second holes 351 and 352. When viewed in a plan view, the third hole 353 may have a triangular shape as shown in FIG. 3C, or a rectangular shape as shown in FIG. 3E. However, it is to be understood that the shape of the third hole 353 is not limited thereto, but may be variously changed according to exemplary embodiments. The conductive member may be disposed in the first hole 351, the second hole 352, and the third hole 353.

The conductive member 500 may be disposed in the recess 350 of the housing 300. The conductive member 500 may include a first via portion 510, a second via portion 520, and an interconnection portion 530. The first via portion 510 may be disposed in the first hole 351 and may be electrically connected to the second upper conductive pattern 122. The second via portion 520 may be disposed in the second hole 352 and may be electrically connected to the third upper conductive pattern 130. When viewed in a plan view, the second via portion 520 may be spaced apart from the second upper conductive pattern 122. The interconnection portion 530 may be disposed in the third hole 353. The interconnection portion 530 may be disposed on the first and second via portions 510 and 520. The interconnection portion 530 may be electrically connected to the first and second via portions 510 and 520. When viewed in a plan view, the interconnection portion 530 may have a triangular shape as shown in FIG. 3C or a rectangular shape as shown in FIG. 3E. However, it is to be understood that the shape of the interconnection portion 530 is not limited thereto, and may be variously changed according to exemplary embodiments.

In an exemplary embodiment, the interconnection portion 530 may further extend onto the top surface 350a of the recess 350. The first via portion 510, the second via portion 520, and the interconnection portion 530 may be formed into a single body. For example, the interconnection portion 530 may include the same material as that of the first and second via portions 510 and 520, and may be electrically connected to the first and second via portions 510 and 520 without boundaries therebetween. For example, the first via portion 510, the second via portion 520, and the interconnection portion 530 may be integrally formed as a single body. In exemplary embodiments, even when the third upper conductive pattern 130 is physically spaced apart from the second upper conductive pattern 122, the third upper conductive pattern 130 may be electrically connected to the second upper conductive pattern 122 through the conductive member 500. Accordingly, the second voltage V2 may be transferred through the conductive member 500 to the third upper conductive pattern 130. In FIG. 3D, a bold solid line schematically indicates a transfer path of the second voltage V2.

Figure 3F:
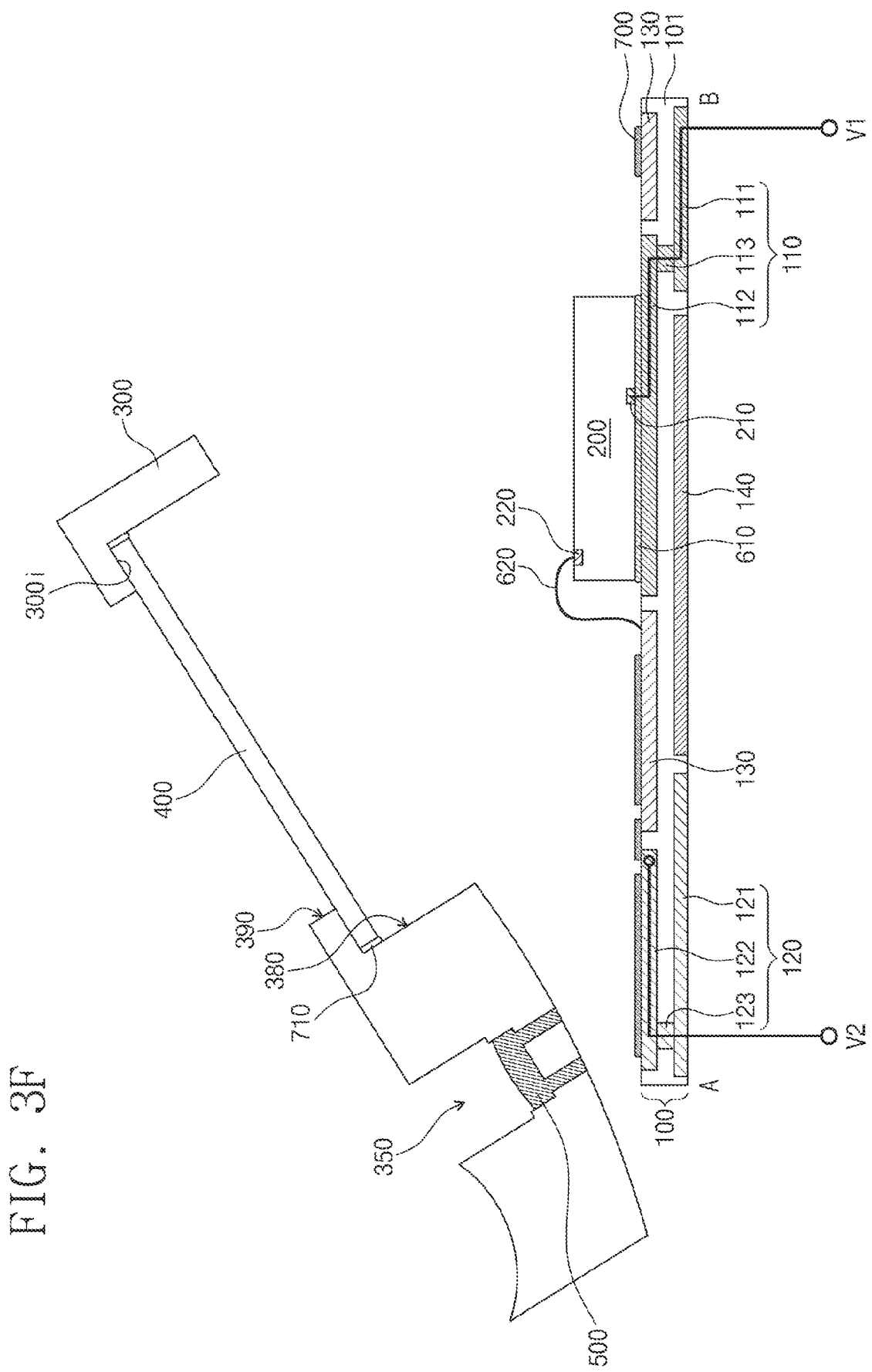
FIG. 3F illustrates a cross-sectional view showing the operation of a light emitting device and a conductive member according to exemplary embodiments.

FIG. 3F illustrates a cross-sectional view showing the operation of a light emitting device and a conductive member according to exemplary embodiments. In FIG. 3F, a bold solid line schematically indicates an electrical transfer path.

Referring to FIG. 3F, the lens 400 may spread or diffuse the light generated from the light source package 1. The housing 300 may be damaged or detached while the light source package 1 operates. The damage or detachment of the housing 300 may include, for example, any type of physical damage to the housing 300 or physical separation of the housing 300 from the substrate 100. When the housing 300 is damaged or detached, the light generated from the light source package 1 may be directly emitted outwardly without passing through the lens 400. As a result, a target object may be damaged when the target object is irradiated with light of high intensity emitted from the light emitting device 200. In exemplary embodiments, the light emitting device 200 may be employed to recognize human faces, and an infrared ray source may be utilized for facial recognition. Light emitted from a laser device may be emitted in a substantially straight line. When the light emitting device 200 is a laser device, the light emitted by the light emitting device 200 may be substantially straight, and may be intensively concentrated on a target object. In a case in which the light source package 1 is used to recognize a user's face, the user may be injured due to the light of high intensity concentrated thereon. For example, the light may injure the user's eyes.

In exemplary embodiments, when the housing 300 is damaged or detached, the conductive member 500 may become spaced apart from the substrate 100. As a result, the conductive member 500 may not be electrically connected to one or more of the second upper conductive pattern 122 and the third upper conductive pattern 130. In this case, although the second voltage V2 is applied to the second upper conductive pattern 122, the second voltage V2 may not be transferred to the third upper conductive pattern 130. Accordingly, the light emitting device 200 may not receive the second voltage V2, and thus, may stop its operation. Thus, in exemplary embodiments, even though the housing 300 is damaged or detached, damage to a target object caused by the light may be prevented.

The formation of a conductive member according to exemplary embodiments will be described below.

Figure 4A:
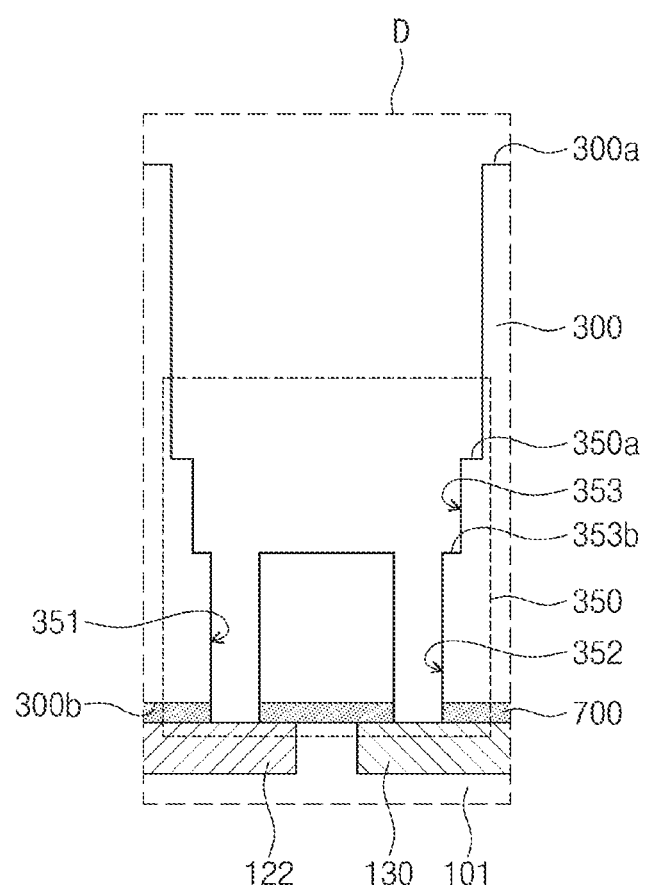
FIGS. 4A and 4B illustrate cross-sectional views showing a method of forming a conductive member according to exemplary embodiments.
Figure 4B:
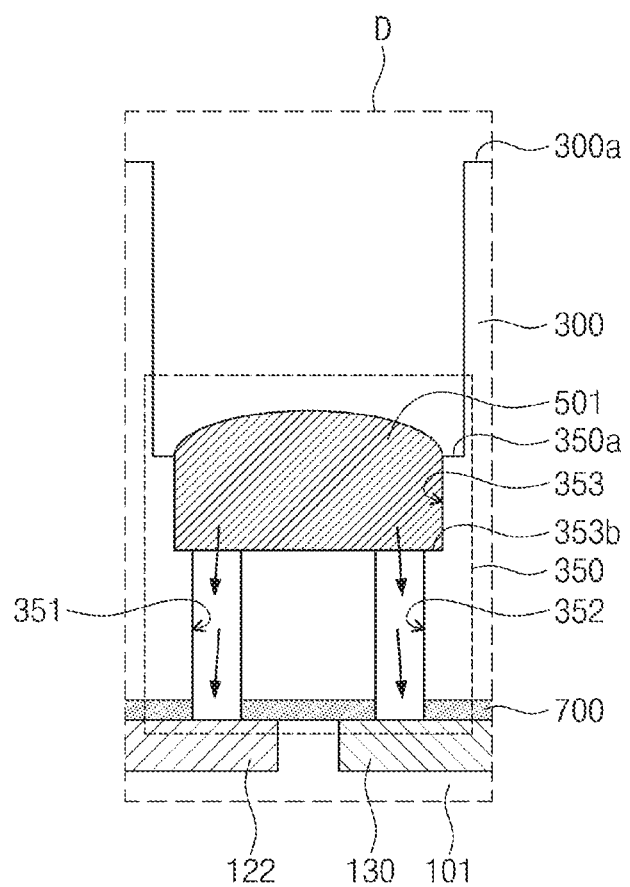

FIGS. 4A and 4B illustrate cross-sectional views showing a method of forming a conductive member according to exemplary embodiments. FIGS. 4A and 4B illustrate enlarged cross-sectional views showing section D of FIG. 3B taken along line A'-B' of FIG. 3C. For convenience of explanation, a further description of elements and technical aspects previously described will be omitted below.

Referring to FIGS. 2, 3A to 3C, and 4A, the housing 300 may be prepared. The first hole 351, the second hole 352, and the third hole 353 may be formed in the housing 300. The third hole 353 may be formed on the top surface 350a of the recess 350. Each of the first and second holes 351 and 352 may penetrate a floor surface 353b of the third hole 353 and a lowermost bottom surface 300b of the housing 300. The second hole 352 may be spaced apart from the first hole 351.

The housing 300 may be fixed on the substrate 100. The fixing of the housing 300 may include placing the housing 300 to allow the lowermost bottom surface 300b to face the substrate 100 and forming the adhesive layer 700 between the housing 300 and the substrate 100. The placing of the housing 300 may include causing the first hole 351 to vertically overlap the second upper conductive pattern 122 and causing the second hole 352 to vertically overlap the third upper conductive pattern 130. In exemplary embodiments, the adhesive layer 700 does not extend into the first and second holes 351 and 352.

Referring sequentially to FIGS. 4B and 3D, a conductive material 501 may be disposed in the third hole 353. The conductive material 501 may include, for example, a solder paste, a solder material, a conductive ink, or a conductive paste. Each of the first and second holes 351 and 352 may have a relatively small diameter, such that the conductive material 501 may be difficult to fill the first and second holes 351 and 352. A reflow process may be performed on the housing 300. The reflow process may be carried out at a temperature the same as or higher than a melting point of the conductive material 501. As illustrated by arrows in FIG. 4B, the conductive material 501 may melt and extend into the first and second holes 351 and 352 during the reflow process. As shown in FIG. 2, the top surface 350a of the recess 350 may neighbor an outer sidewall of the housing 300. For example, the top surface 350a of the recess 350 may be disposed adjacent to the outer sidewall of the housing 300. The floor surface 353b of the third hole 353 may be disposed at a lower level than that of the top surface 350a of the recess 350. The third hole 353 may prevent the conductive material 501 from flowing downwardly along the outer sidewall of the housing 300 when the reflow process is performed. As a result, the conductive material 501 may satisfactorily fill the first and second holes 351 and 352.

As shown in FIG. 3D, the reflow process may allow the conductive material 501 to fill the first and second holes 351 and 352, which may result in the formation of the first via portion 510 and the second via portion 520. The reflow process may continue until the first via portion 510 is coupled to the second upper conductive pattern 122 and the second via portion 520 is coupled to the third upper conductive pattern 130. After the reflow process, the conductive material 501 remaining in the second hole 352 may form the interconnection portion 530. In this way, the conductive member 500 may be finally formed.

Figure 5A:
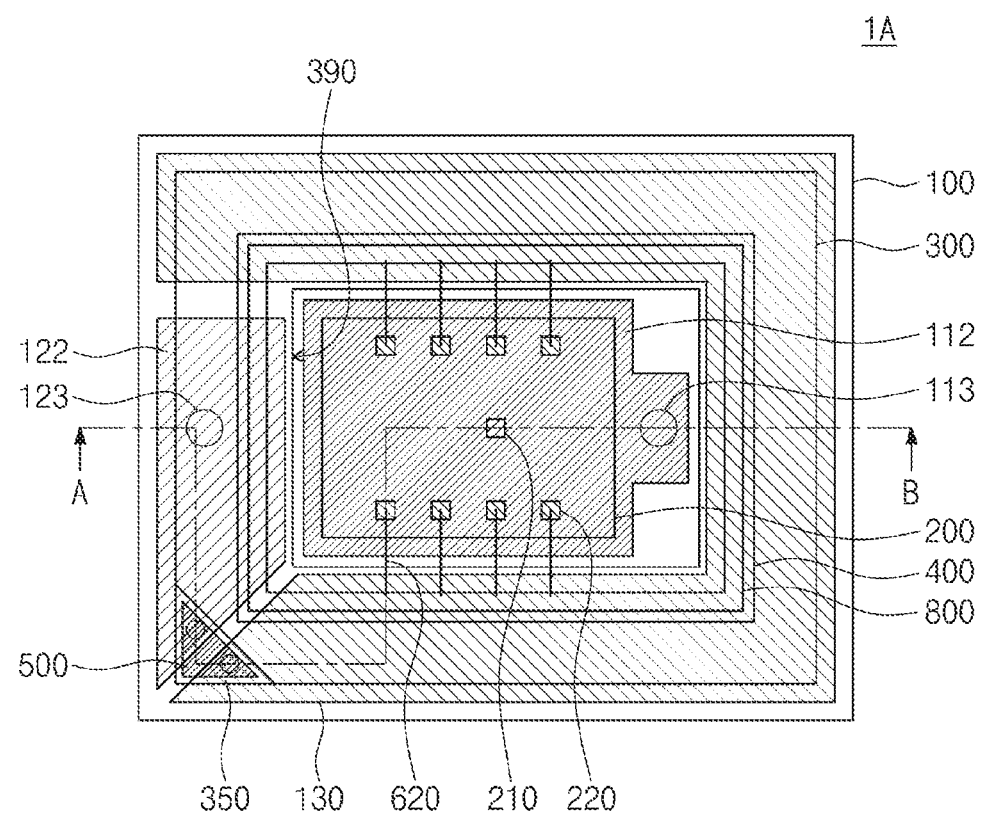
FIG. 5A illustrates a plan view showing a light source package according to exemplary embodiments.
Figure 5B:
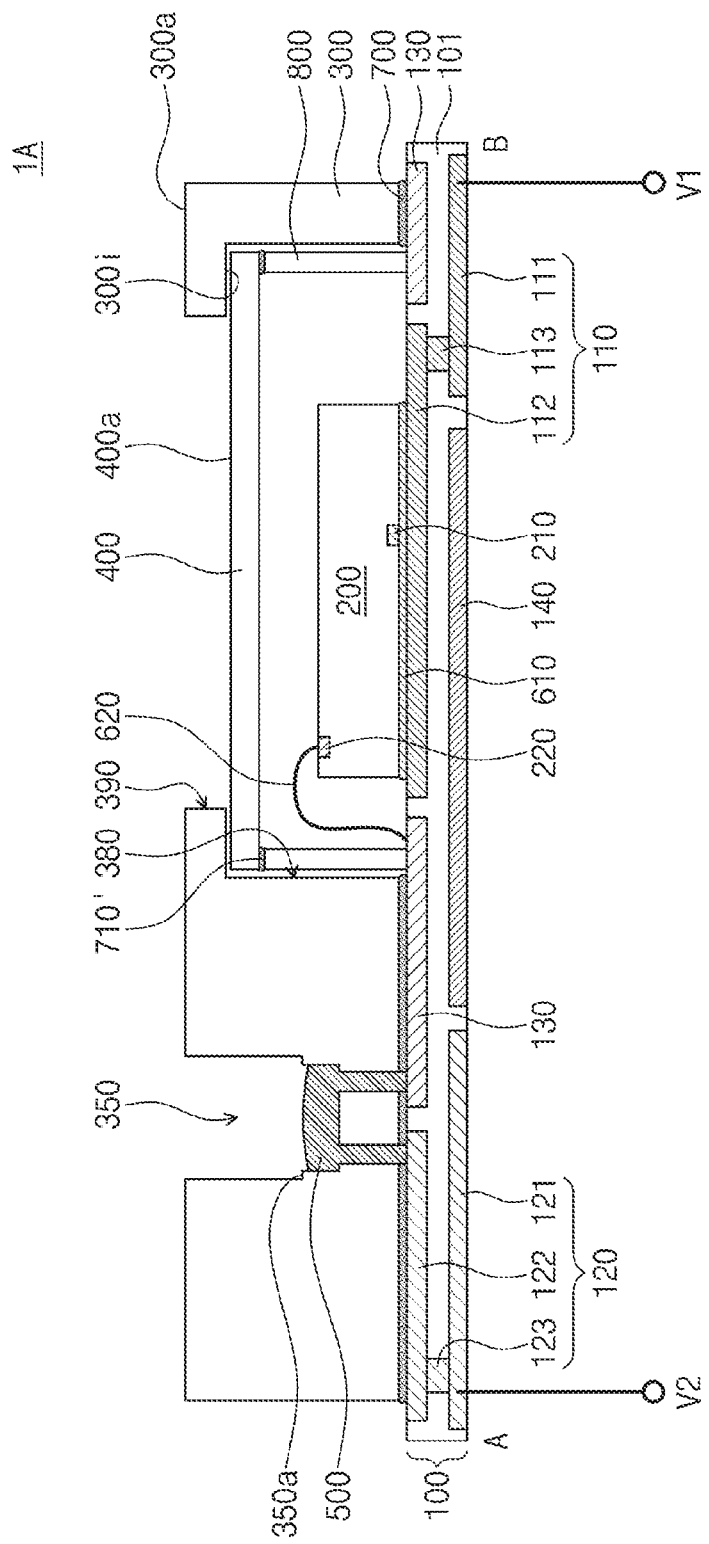
FIG. 5B illustrates a cross-sectional view taken along line A-B of FIG. 5A.

FIG. 5A illustrates a plan view showing a light source package according to exemplary embodiments. FIG. 5B illustrates a cross-sectional view taken along line A-B of FIG. 5A.

Referring to FIGS. 1A, 1B, 2, 5A, and 5B, a light source package 1A may further include an inner housing 800 in addition to the substrate 100, the light emitting device 200, the housing 300, the lens 400, and the conductive member 500.

The inner housing 800 may be disposed on the substrate 100. The inner housing 800 may be disposed between the light emitting device 200 and the housing 300. For example, the inner housing 800 may include a different material from that of the substrate 100. In an exemplary embodiment, the inner housing 800 and the substrate 100 may be formed into a single body. In this case, the inner housing 800 may include the same material as that of one of the dielectric layer 101 and the conductive patterns 121, 122, and 130.

The lens 400 may be disposed on the inner housing 800. An adhesive pattern 710' may be interposed between the lens 400 and the inner housing 800. The adhesive pattern 710' may fix the lens 400 on the inner housing 800.

The substrate 100, the light emitting device 200, the housing 300, and the conductive member 500 may be substantially the same as those discussed above with reference to FIGS. 1A to 3F. For example, the lens 400 may be interposed between the light emitting device 200 and the inner surface 300i of the housing 300. The housing 300 may be disposed on the side surface and a portion of the top surface 400a of the lens 400.

Figure 6:
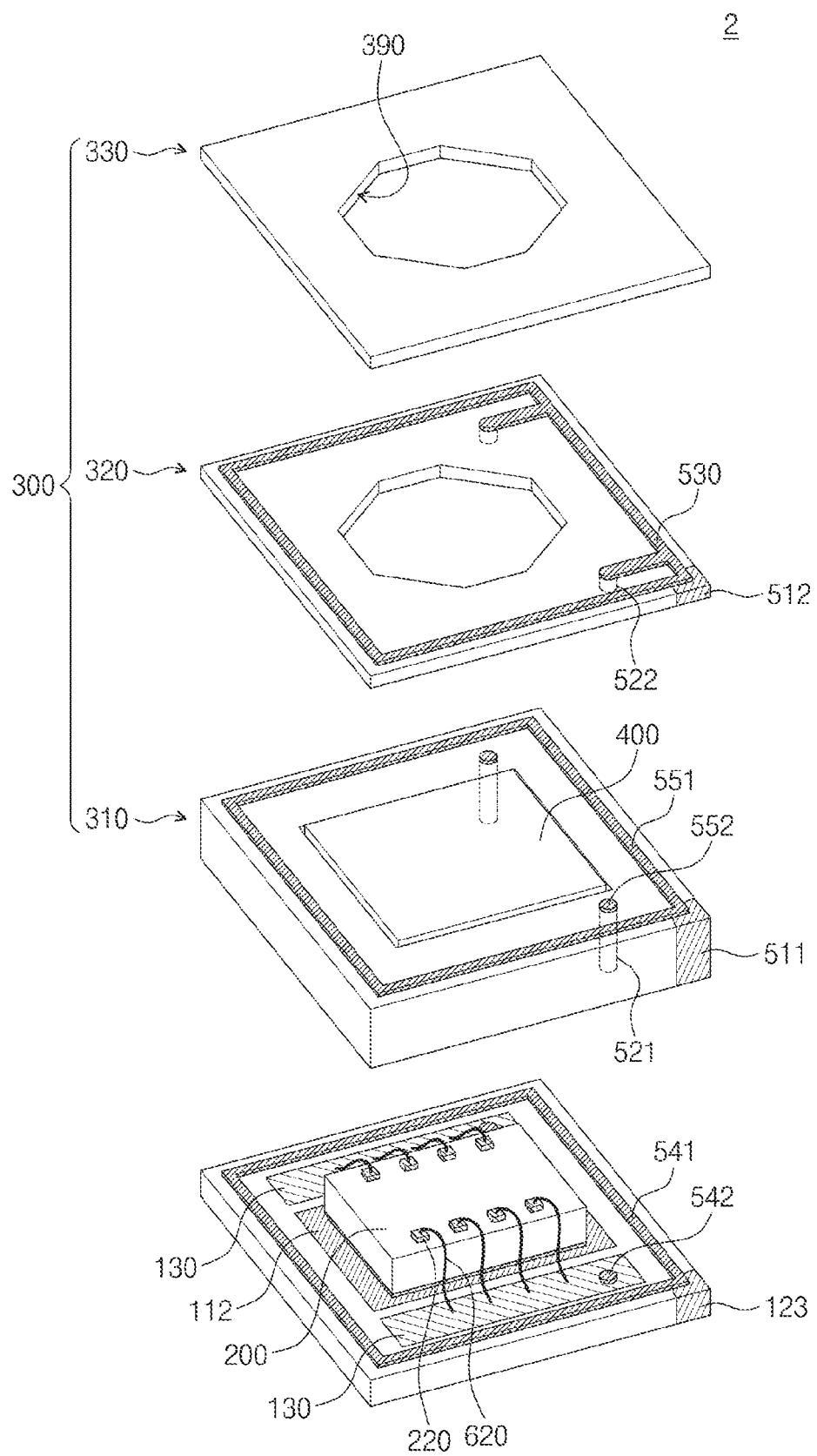
FIG. 6 illustrates an exploded perspective view showing a light source package according to exemplary embodiments.
Figure 7:
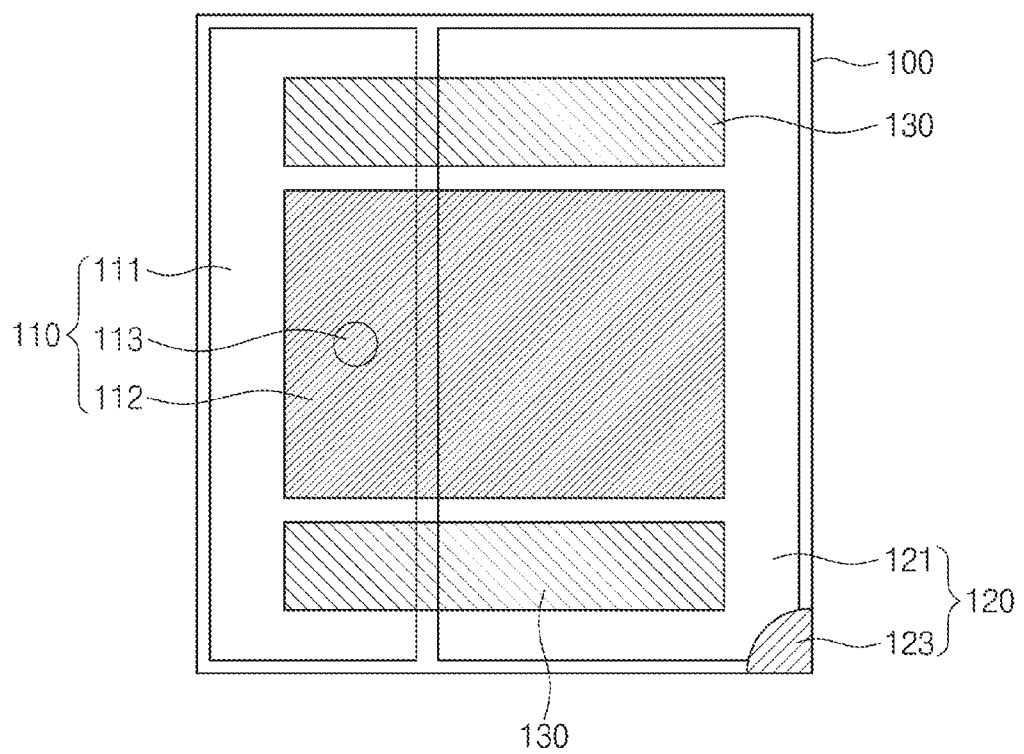
FIG. 7 illustrates a plan view showing a substrate according to exemplary embodiments.
Figure 8A:
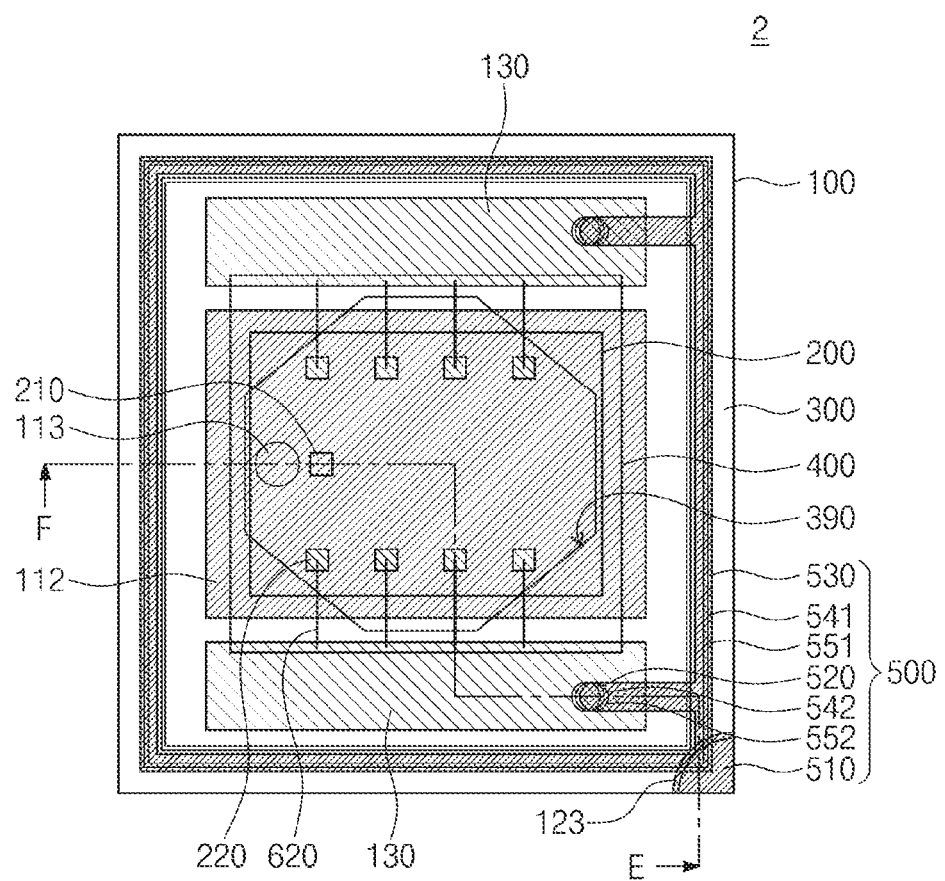
FIG. 8A illustrates a plan view showing the light source package of FIG. 6.
Figure 8B:
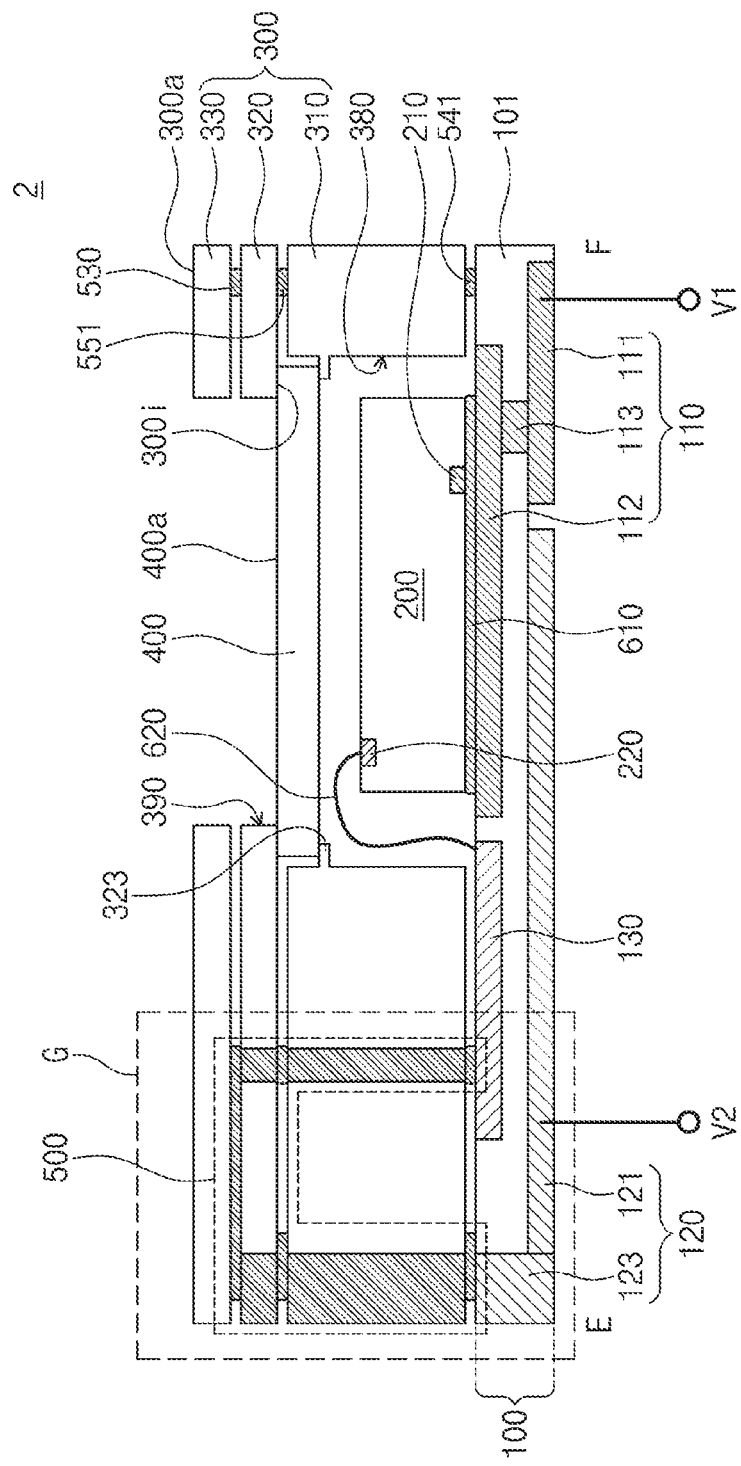
FIG. 8B illustrates a cross-sectional view taken along line E-F of FIG. 8A.
Figure 8C:
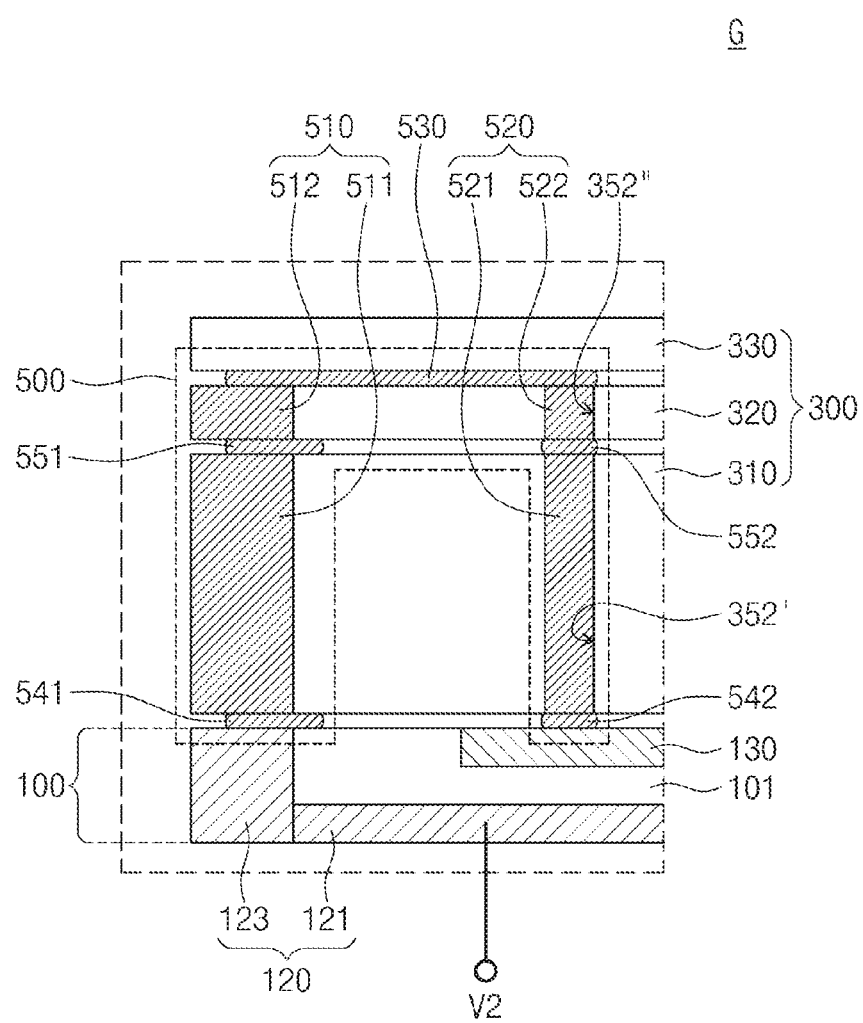
FIG. 8C illustrates an enlarged view of section G shown in FIG. 8B.

FIG. 6 illustrates an exploded perspective view showing a light source package according to exemplary embodiments. FIG. 7 illustrates a plan view showing a substrate according to exemplary embodiments. FIG. 8A illustrates a plan view showing the light source package of FIG. 6. FIG. 8B illustrates a cross-sectional view taken along line E-F of FIG. 8A. FIG. 8C illustrates an enlarged view of section G shown in FIG. 8B.

Referring to FIGS. 6, 7, 8A, 8B, and 8C, a light source package 2 may include the substrate 100, the light emitting device 200, the housing 300, the lens 400, and the conductive member 500. For example, the substrate 100 shown in FIG. 7 may be used to fabricate the light source package 2. The substrate 100 may include the dielectric layer 101, the first conductive structure 110, the second conductive structure 120, and the third upper conductive pattern 130. The dielectric layer 101 and the first conductive structure 110 may be substantially the same as those discussed above with reference to FIGS. 1A and 3B.

The second conductive structure 120 may include the second lower conductive pattern 121 and the second conductive via 123. As shown in FIG. 8B, the second conductive via 123 may penetrate the dielectric layer 101 and be connected to the second lower conductive pattern 121. Unlike the substrate 100 of FIG. 1A, in an exemplary embodiment according to FIGS. 6, 7, 8A, 8B, and 8C, the substrate 100 does not include the second upper conductive pattern 122 connected to the second conductive via 123.

The third upper conductive pattern 130 may be disposed on a top surface of the dielectric layer 101. The dielectric layer 101 may be interposed between the third upper conductive pattern 130 and the first conductive structure 110. The third upper conductive pattern 130 may be spaced apart from the first conductive via 113. In exemplary embodiments, the third upper conductive pattern 130 is not directly coupled to the first conductive via 113. As shown in FIG. 7, the third upper conductive pattern 130 may include a plurality of third upper conductive patterns that are separated from each other.

As shown in FIGS. 6, 8A, and 8B, the light emitting device 200 may be disposed on the first upper conductive pattern 112. The first voltage V1 may be applied to the first terminal 210 of the light emitting device 200 through the first conductive structure 110 and the conductive adhesive layer 610. When viewed in a plan view, the light emitting device 200 may be spaced apart from the third upper conductive patterns 130. The second terminals 220 may be disposed on a top surface of the light emitting device 200, and may be coupled to the third upper conductive pattern 130 through the bonding wires 620. As a result, the light emitting device 200 may be electrically connected to the third upper conductive patterns 130.

The housing 300 may be disposed on the substrate 100. The housing 300 may include a first housing 310, a second housing 320, and a third housing 330 that are stacked. The first housing 310 may be disposed on the substrate 100. The first housing 310 may have the cavity 380 disposed therein. The light emitting device 200 and the lens 400 may be disposed in the cavity 380. A protrusion 323 may be disposed on an inner surface of the first housing 310. The lens 400 may be disposed on the protrusion 323. An adhesive pattern may further be disposed between the lens 400 and the first housing 310, attaching the lens 400 to the first housing 310.

The second housing 320 and the third housing 330 may be disposed on the first housing 310. The opening 390 may be penetrate the inner surface 300i and the outer surface of the housing 300. The inner surface 300i of the housing 300 may correspond to an inner surface of the second housing 320, and the outer surface of the housing 300 may correspond to an outer surface of the third housing 330. For example, the opening 390 may penetrate the inner surface 300i of the second housing 320 and the outer surface of the third housing 330. The inner surface 300i of the second housing 320 may face the lens 400.

When viewed in a plan view, the opening 390 may overlap the lens 400. Light passing through the lens 400 may be outwardly emitted through the opening 390. When viewed in a plan view, the opening 390 may have a hexagonal shape as shown in FIG. 8A. However, the shape of the opening 390 is not limited thereto, and may be variously changed according to exemplary embodiments. For example, the opening 390 may have a rectangular or circular shape when viewed in a plan view.

The second and third housings 320 and 330 may serve as a lens cover. The uppermost top surface 300a of the housing 300 may be located at a higher level than that of the top surface 400a of the lens 400. The uppermost top surface 300a of the housing 300 may correspond to an uppermost top surface of the third housing 330. The opening 390 may have a width less than that of the lens 400. Accordingly, the second housing 320 may be disposed on at least a portion of the top surface 400a of the lens 400. As a result, the lens 400 may be prevented from being outwardly detached.

The conductive member 500 may be disposed in the housing 300. The conductive member 500 may have one end coupled to the second conductive via 123 and the other end coupled to one of the third upper conductive patterns 130. The one end of the conductive member 500 may correspond to a portion of a first lower conductive adhesive pattern 541 of FIG. 8C, and the other end of the conductive member 500 may correspond to a second lower conductive adhesive pattern 542 of FIG. 8C. The second voltage V2 applied to the second conductive structure 120 may be transferred through the conductive member 500 to the third upper conductive patterns 130. For example, the third upper conductive patterns 130 may be electrically connected through the conductive member 500 to the second conductive structure 120. In this configuration, the second voltage V2 may be applied to the second terminals 220 of the light emitting device 200.

In exemplary embodiments, when the housing 300 is damaged or detached, the housing 300 may become spaced apart from the substrate 100. In this case, the conductive member 500 may be physically spaced apart from and electrically insulated from one or more of the second conductive via 123 and the third upper conductive pattern 130. As a result, the second voltage V2 applied to the second conductive via 123 is not transferred to the third upper conductive patterns 130. Thus, in exemplary embodiments, the light emitting device 200 stop its operation.

The conductive member 500 may include the first via portion 510, the second via portion 520, and the interconnection portion 530, and further include lower conductive adhesive patterns 541 and 542 and upper conductive adhesive patterns 551 and 552. FIGS. 6 and 8C are referred to hereinafter to describe in detail the first via portion 510, the second via portion 520, the interconnection portion 530, the lower conductive adhesive patterns 541 and 542, and the upper conductive adhesive patterns 551 and 552.

The lower conductive adhesive patterns 541 and 542 may be interposed between the substrate 100 and the first housing 310. The lower conductive adhesive patterns 541 and 542 may attach the first housing 310 to the substrate 100. The lower conductive adhesive patterns 541 and 542 may include a first lower conductive adhesive pattern 541 and a second lower conductive adhesive pattern 542. The lower conductive adhesive patterns 541 and 542 may be caused to form a gap between the first housing 310 to the substrate 100. The first lower conductive adhesive pattern 541 may have a closed loop shape when viewed in a plan view. When viewed in a plan view, the first lower conductive adhesive pattern 541 may be spaced apart from the light emitting device 200, while surrounding the light emitting device 200. In an exemplary embodiment, when viewed in a plan view, the first lower conductive adhesive pattern 541 may completely surround the light emitting device 200. For example, the first lower conductive adhesive pattern 541 may be a continuous structure including no breaks or openings. The second lower conductive adhesive pattern 542 may be disposed on at least one of the third upper conductive patterns 130. The second lower conductive adhesive pattern 542 may be spaced apart from the first lower conductive adhesive pattern 541. However, the present inventive concept is not limited thereto. In exemplary embodiments, the substrate 100 may be coated thereon with a conductive adhesive to form the lower conductive adhesive patterns 541 and 542. The conductive adhesive may include, for example, a solder material, a conductive paste such as a metal paste, or a conductive ink. Alternatively, the conductive adhesive may include a resin in which conductive particles are distributed.

The first via portion 510 may include a first lower via portion 511 and a first upper via portion 512 that are electrically connected to each other. The first lower via portion 511 may be disposed on an outer surface of the first housing 310 or disposed in the first housing 310. For example, a portion of the first lower via portion 511 may be exposed on an outer sidewall of the first housing 310. In an exemplary embodiment, unlike the figures, the first lower via portion 511 may be disposed in a hole that penetrates the first housing 310. The first lower via portion 511 may be disposed on the second conductive via 123 of the substrate 100. The first lower conductive adhesive pattern 541 may be interposed between the second conductive via 123 and the first lower via portion 511. The first lower via portion 511 may be coupled to the second conductive via 123 through the portion of the first lower conductive adhesive pattern 541.

The first upper via portion 512 may be disposed on a side surface of the second housing 320 or disposed in the second housing 320. A portion of the first upper via portion 512 may be exposed on the side surface of the second housing 320. The first upper via portion 512 may be disposed on and aligned with the first lower via portion 511. The first lower via portion 511 and the first upper via portion 512 may include a conductive material such as, for example, copper.

The second via portion 520 may include a second lower via portion 521 and a second upper via portion 522 that are electrically connected to each other. The second lower via portion 521 may be disposed in the first housing 310. For example, the second lower via portion 521 may be disposed in a lower hole 352' that penetrates the first housing 310. The second lower via portion 521 may be disposed on at least one of the third upper conductive patterns 130. The second lower conductive adhesive pattern 542 may be interposed between the second lower via portion 521 and the third upper conductive pattern 130 that corresponds to the second lower via portion 521. The second lower via portion 521 may be coupled through its corresponding second lower conductive adhesive pattern 542 to the third upper conductive pattern 130.

The second upper via portion 522 may be disposed in the second housing 320. For example, the second upper via portion 522 may be disposed in an upper hole 352" that penetrates the second housing 320. The second upper via portion 522 may be disposed on and aligned with the second lower via portion 521. The second lower via portion 521 and the second upper via portion 522 may include a conductive material such as, for example, copper.

The upper conductive adhesive patterns 551 and 552 may be interposed between the first housing 310 and the second housing 320. The upper conductive adhesive patterns 551 and 552 may attach the second housing 320 to the first housing 310. The upper conductive adhesive patterns 551 and 552 may be caused to form a gap between the first housing 310 and the second housing 320. The upper conductive adhesive patterns 551 and 552 may include a first upper conductive adhesive pattern 551 and a second upper conductive adhesive pattern 552. The first upper conductive adhesive pattern 551 may have a closed loop shape when viewed in a plan view. When viewed in a plan view, the first upper conductive adhesive pattern 551 may be spaced apart from the lens 400, while surrounding the lens 400. In an exemplary embodiment, when viewed in a plan view, the first upper conductive adhesive pattern 551 may completely surround the lens 400. For example, the first upper conductive adhesive pattern 551 may be a continuous structure including no breaks or openings. When viewed in a plan view, the first upper conductive adhesive pattern 551 may overlap the first lower conductive adhesive pattern 541. However, the present inventive concept is not limited thereto.

The second upper conductive adhesive pattern 552 may be disposed between the second lower via portion 521 and the second upper via portion 522. The second upper via portion 522 may be electrically connected to the second lower via portion 521 through the second upper conductive adhesive pattern 552. The second upper via portion 522 may be attached to the second lower via portion 521 through the second upper conductive adhesive pattern 552. The second upper conductive adhesive pattern 552 may be spaced apart from the first upper conductive adhesive pattern 551. However, the present inventive concept is not limited thereto. For example, in an exemplary embodiment, the second upper conductive adhesive pattern 552 may be disposed adjacent to the first upper conductive adhesive pattern 551 with no space therebetween. In exemplary embodiments, the first housing 310 may be coated on its top surface with a conductive adhesive to form the upper conductive adhesive patterns 551 and 552. The conductive adhesive may include the same material as that described above with reference to the lower conductive adhesive patterns 541 and 542.

The interconnection portion 530 may be disposed on the second housing 320. The interconnection portion 530 may be coupled to the first and second via portions 510 and 520. For example, the interconnection portion 530 may connect the first upper via portion 512 to the second upper via portion 522. In this configuration, the second voltage V2 applied to the second conductive structure 120 may be transferred through the conductive member 500 to the third upper conductive patterns 130. The interconnection portion 530 may attach the third housing 330 to the second housing 320. A portion of the interconnection portion 530 may have a closed loop shape when viewed in a plan view. When viewed in a plan view, the interconnection portion 530 may partially overlap one or more of the first lower conductive adhesive pattern 541 and the first upper conductive adhesive pattern 551. However, the present inventive concept is not limited thereto. In exemplary embodiments, a conductive adhesive may be coated on the second housing 320 to form the interconnection portion 530.

In an exemplary embodiment, the second via portion 520 may be provided in plural. Accordingly, detachment or damage of the housing 300 at more various locations may affect the operation of the light emitting device 200. For example, when a plurality of second via portions 520 is included, detachment or damage detection may be improved. That is, in such an exemplary embodiment, detachment or damage may be detected in an increased number of locations, and operation of the light emitting device 200 may be stopped in a greater number of situations. In an exemplary embodiment, a single second via portion 520 may be provided instead of a plurality of second via portions 520. In this case, the fabrication of the conductive member 500 may be simplified.

When the second housing 320 is detached from the first housing 310, the lens 400 may become separated from the first housing 310. In this case, light emitted from the light emitting device 200 may be incident on a target object, without passing through the lens 400. In exemplary embodiments, the first upper via portion 512, the second upper via portion 522, and the interconnection portion 530 may be disposed in and on the second housing 320. When the second housing 320 is detached from the first housing 310, the conductive member 500 may be electrically insulated from one or more of the second conductive structure 120 and the third upper conductive pattern 130. As a result, the light emitting device 200 may no longer be supplied with the second voltage V2, and thus, the light emitting device 200 may stop its operation. In exemplary embodiments, even though the second housing 320 may become detached from the first housing 310, a target object may not be irradiated with light of extremely high intensity. Thus, according to exemplary embodiments, the target object may be prevented from being damaged.

Figure 9:
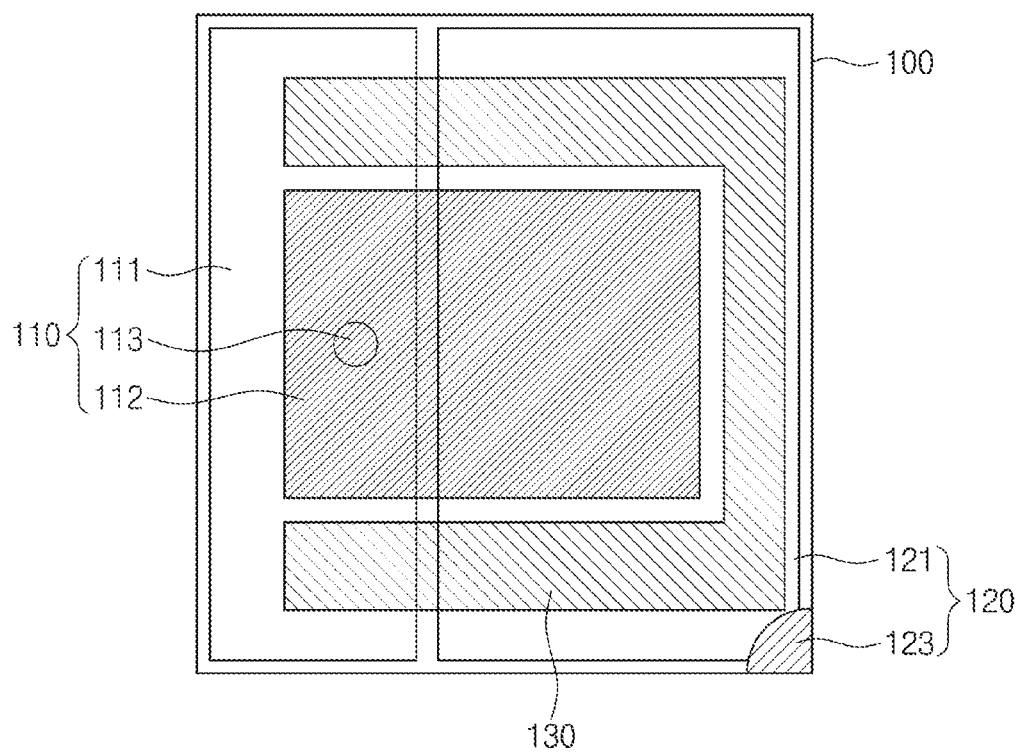
FIG. 9 illustrates a plan view showing a substrate according to exemplary embodiments.

FIG. 9 illustrates a plan view showing a substrate according to exemplary embodiments.

Referring to FIG. 9, the substrate 100 may include the dielectric layer 101, the first conductive structure 110, the second conductive structure 120, and the third upper conductive pattern 130. The dielectric layer 101, the first conductive structure 110, and the second conductive structure 120 may be substantially the same as those discussed above with reference to FIG. 7. Unlike the exemplary embodiment of FIG. 7, the substrate 100 may include a single third upper conductive pattern 130. The substrate 100 of FIG. 9 may be used to fabricate the light source package 2 shown in FIGS. 6 and 8A to 8C. The number and shape of the third upper conductive pattern 130 may be variously changed.

Figure 10A:
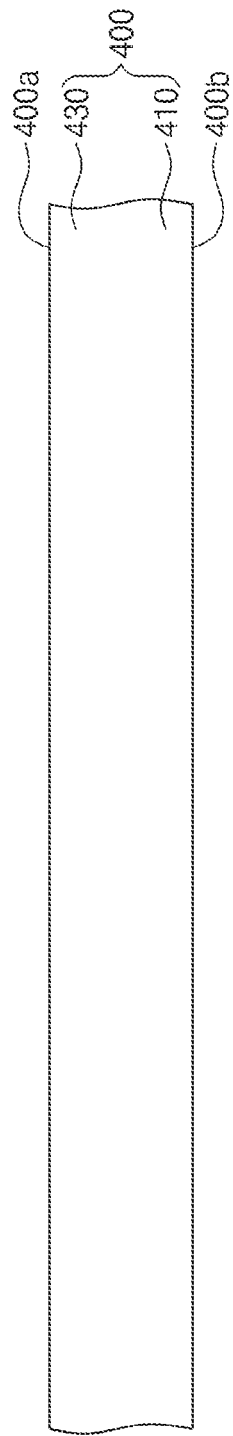
Figure 10B:
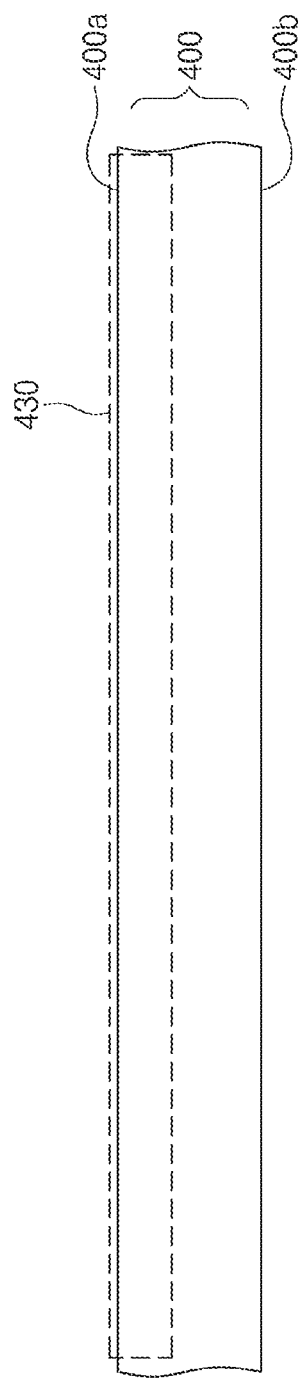

FIGS. 10A to 10C illustrate cross-sectional views showing a lens according to exemplary embodiments.

Referring to FIGS. 10A to 10C, the lens 400 may have a top surface 400a and a bottom surface 400b that face each other. The top and bottom surfaces 400a and 400b of the lens 400 may be substantially flat. For example, the top and bottom surfaces 400a and 400b of the lens 400 may be exactly flat, or if not exactly flat, may be approximately flat within a measurement error as would be understood by a person having ordinary skill in the art. In an exemplary embodiment, the lens 400 may include a plurality of layers. Alternatively, in an exemplary embodiment, the lens 400 may include a single layer.

Referring to FIG. 10A, an upper portion 430 of the lens 400 may include an extension layer from which light is emitted. The lens 400 may be configured such that the upper portion 430 is closer than a lower portion 410 to the top surface 400a. For example, the lens 400 may be configured such that a distance between the upper portion 430 and the top surface 400a is less than a distance between the lower portion 410 and the top surface 400a. The lower portion 410 of the lens 400 may include a pattern formation layer configured to form a structured light. For example, light may pass through the lower portion 410 of the lens 400 and then form certain patterns.

Referring to FIG. 10B, the upper portion 430 of the lens 400 may serve as an extension layer and a pattern formation layer. The upper portion 430 of the lens 400 may include a diffractive optical element (DOE). However, the present inventive concept is not limited thereto.

Referring to FIG. 10C, the upper portion 430 of the lens 400 may include an extension layer. The lower portion 410 and an intermediate portion 420 of the lens 400 may serve as a pattern formation layer. The intermediate portion 420 may be disposed between the upper and lower portions 430 and 410 of the lens 400. A pattern formation layer in the intermediate portion 420 of the lens 400 may be different from a pattern formation layer in the lower portion 410 of the lens 400. However, the present inventive concept is not limited thereto. For example, a structured light formed at the intermediate portion 420 of the lens 400 may be different from that formed at the lower portion 410 of the lens 400.

According to exemplary embodiments of the present inventive concept, a housing may be provided in which a conductive member is coupled to a second conductive structure and a third upper conductive pattern. When the housing is damaged or detached, the conductive member may be insulated from one or more of the second conductive structure and the third upper conductive pattern. When this occurs, a light emitting device may no longer be supplied with a voltage, and as a result, may stop its operation. Thus, even though the housing is damaged or detached, a target object may not be irradiated with light of extremely high intensity. As a result, the target object may be prevented from being damage.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A light source package, comprising:
a substrate;
a light emitting device disposed on the substrate;
a lens disposed on the light emitting device, wherein the lens is spaced apart from the light emitting device;
a housing disposed on the substrate, wherein the housing is disposed on a side surface and a portion of a top surface of the lens; and
a conductive member disposed in the housing, wherein the conductive member is electrically connected to the light emitting device.

2. The light source package of claim 1, wherein the substrate comprises:
a conductive structure; and
an upper conductive pattern spaced apart from the conductive structure,
wherein the upper conductive pattern is electrically connected to the conductive structure through the conductive member.

3. The light source package of claim 2, wherein the conductive structure is a second conductive structure, and the substrate further comprises a first conductive structure insulated from the second conductive structure.

4. The light source package of claim 3, wherein the light emitting device comprises a first terminal and a second terminal,
the first terminal is disposed on a bottom surface of the light emitting device and is electrically connected to the first conductive structure, and
the second terminal is disposed on a top surface of the light emitting device and is electrically connected to the upper conductive pattern.

5. The light source package of claim 3, wherein the first conductive structure is configured to receive a first voltage, and the second conductive structure is configured to receive a second voltage different from the first voltage.

6. The light source package of claim 1, wherein the housing comprises:

a first hole that penetrates a lowermost bottom surface of the housing;

a second hole that penetrates the lowermost bottom surface of the housing and is spaced apart from the first hole; and a third hole that penetrates a top surface of the housing and is connected to the first hole and the second hole.

7. The light source package of claim 6, wherein the conductive member is disposed in the first hole, the second hole, and the third hole, and the conductive member comprises a solder material, a solder paste, a conductive paste, or a conductive ink.

8. The light source package of claim 1, wherein the housing comprises a recess, and the conductive member is disposed in the recess.

9. The light source package of claim 1, further comprising:

an adhesive pattern disposed between the housing and the lens, wherein the adhesive pattern fixes the lens on the housing.

10. The light source package of claim 1, further comprising:

an inner housing disposed on the substrate and between the light emitting device and the housing, wherein the lens is disposed on the inner housing.

11. A light source package, comprising:

a substrate;

a laser device mounted on the substrate;

a housing disposed on a top surface of the substrate and spaced apart from the laser device;

a conductive member disposed in the housing and electrically connected to the laser device: and a lens disposed between the laser device and the housing, wherein an uppermost top surface of the housing is disposed at a higher level than a level of a top surface of the lens.

12. The light source package of claim 11, wherein the substrate comprises:

a conductive structure configured to receive a voltage, and an upper conductive pattern spaced apart from the conductive structure, wherein the upper conductive pattern receives the voltage through the conductive member.

13. The light source package of claim 12, wherein a first end of the conductive member is electrically connected to the conductive structure, and a second end of the conductive member is electrically connected to the upper conductive pattern.

14. A light source package, comprising:

a substrate;

a light emitting device disposed on the substrate;

a housing disposed on the substrate and comprising an inner surface that faces the light emitting device;

a lens disposed between a top surface of the light emitting device and the inner surface of the housing; and a conductive member disposed in the housing and electrically connected to the light emitting device.

15. The light source package of claim 14, wherein the housing comprises an opening that penetrates the inner surface and an outer surface of the housing, and the outer surface faces the inner surface.

16. The light source package of claim 14, wherein the substrate comprises:

a first upper conductive pattern;

a second upper conductive pattern insulated from the first upper conductive pattern; and a third upper conductive pattern spaced apart from the first upper conductive pattern and the second upper conductive pattern, wherein the third upper conductive pattern is electrically connected to the second upper conductive pattern through the conductive member.

17. The light source package of claim 16, wherein the conductive member comprises:

a first via portion disposed in the housing and electrically connected to the second upper conductive pattern;

a second via portion disposed in the housing and electrically connected to the third upper conductive pattern; and an interconnection portion disposed on the first via portion and the second via portion and electrically connected to the first via portion and the second via portion.

18. The light source package of claim 16, wherein a voltage applied to the second upper conductive pattern is different from a voltage applied to the first upper conductive pattern.

19. The light source package of claim 16, wherein the light emitting device is disposed on the first upper conductive pattern and is coupled to the first upper conductive pattern through a conductive adhesive layer, wherein the conductive adhesive layer is interposed between a top surface of the first upper conductive pattern and a bottom surface of the light emitting device.

20. The light source package of claim 14, wherein the light emitting device comprises a laser diode.

\* \* \* \* \*